(12) United States Patent
Ziger (10) Patent No.: US 6,590,219 B1
(45) Date of Patent: Jul. 8, 2003

(54) APPARATUS AND METHOD FOR FORMING PHOTORESIST PATTERN WITH TARGET CRITICAL DIMENSION

(75) Inventor: David H. Ziger, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 408 days.

(21) Appl. No.: 09/606,376

(22) Filed: Jun. 28, 2000

(51) Int. Cl.[7] .............................. A61N 5/00; G21G 5/00
(52) U.S. Cl. .................................................. 250/492.2
(58) Field of Search ........................ 250/492.2; 359/361

(56) References Cited

U.S. PATENT DOCUMENTS

| | | | | |
|---|---|---|---|---|
| 3,743,417 A | * | 7/1973 | Smatlak ..................... | 359/361 |
| 3,785,722 A | * | 1/1974 | Schultz ...................... | 359/361 |
| 5,204,773 A | * | 4/1993 | Guida ........................ | 359/361 |
| 5,793,544 A | * | 8/1998 | Ogihara et al. ............. | 359/350 |
| 6,108,126 A | * | 8/2000 | Hagiwara et al. ........... | 359/361 |
| 6,115,108 A | * | 9/2000 | Capodieci ................... | 359/432 |
| 6,185,473 B1 | * | 2/2001 | Pierrat ........................ | 700/121 |
| 6,208,747 B1 | * | 3/2001 | Nguyen et al. ............. | 430/395 |
| 6,272,392 B1 | * | 8/2001 | Capodieci ................... | 700/110 |

FOREIGN PATENT DOCUMENTS

| | | |
|---|---|---|
| EP | 0297161 | 1/1989 |
| EP | 0738925 | 10/1996 |
| JP | 59-155839 | 9/1984 |
| JP | 63-163855 | 7/1988 |
| JP | 63163855 | 7/1988 |
| JP | 4-247456 | 9/1992 |

\* cited by examiner

*Primary Examiner*—Jack Berman
*Assistant Examiner*—Johnnie L Smith, II
(74) *Attorney, Agent, or Firm*—Peter Zawilski (57) ABSTRACT

The present invention provides an apparatus and a method for forming a photoresist pattern with a target critical dimension on an exposure field on a semiconductor wafer. The apparatus includes a light source, a lens, and a filter. The light source is adapted to generate actinic radiation for illuminating a photomask pattern onto the exposure field on the semiconductor wafer. The lens is arranged to focus the actinic radiation from the light source. The filter has a substrate that is transparent to the actinic radiation with the substrate being partitioned into a plurality of regions. One or more regions in the substrate is implanted with a dopant species adapted to absorb the actinic radiation from the lens to increase the critical dimension of the one or more regions to the target critical dimension. In this configuration, the plurality of regions in the filter transmits the actinic radiation from the lens to the photomask for illuminating the exposure field on the semiconductor wafer to form a photoresist pattern on the exposure field with the target critical dimension.

29 Claims, 8 Drawing Sheets

Table 300:

| 302 | 304 | 306 | 308 | 310 | 312 | 314 | 316 | 318 |
|---|---|---|---|---|---|---|---|---|
| 0.184 | 0.188 | 0.185 | 0.186 | 0.188 | 0.184 | 0.182 | 0.187 | 0.187 |
| 0.189 | 0.188 | 0.196 | 0.200 | 0.200 | 0.199 | 0.195 | 0.188 | 0.191 |
| 0.196 | 0.198 | 0.199 | 0.200 | 0.199 | 0.200 | 0.198 | 0.196 | 0.197 |
| 0.199 | 0.202 | 0.201 | 0.200 | 0.200 | 0.202 | 0.199 | 0.200 | 0.198 |
| 0.201 | 0.204 | 0.202 | 0.201 | 0.201 | 0.198 | 0.198 | 0.201 | 0.199 |
| 0.202 | 0.202 | 0.201 | 0.200 | 0.202 | 0.200 | 0.200 | 0.203 | 0.201 |
| 0.199 | 0.202 | 0.199 | 0.203 | 0.201 | 0.201 | 0.199 | 0.202 | 0.198 |
| 0.193 | 0.197 | 0.199 | 0.199 | 0.199 | 0.199 | 0.193 | 0.199 | 0.195 |
| 0.184 | 0.196 | 0.194 | 0.195 | 0.196 | 0.195 | 0.195 | 0.195 | 0.194 |
| | 0.190 | 0.193 | 0.192 | 0.194 | 0.193 | 0.193 | 0.194 | 0.195 |
| | 0.185 | 0.193 | 0.193 | 0.195 | 0.194 | 0.193 | 0.186 | 0.187 |

FIG. 3B

Table 350:

| 302 | 304 | 306 | 308 | 310 | 312 | 314 | 316 | 318 |
|---|---|---|---|---|---|---|---|---|
| 0.180 | 0.186 | 0.185 | 0.190 | 0.196 | 0.193 | 0.191 | 0.185 | 0.182 |
| 0.182 | 0.185 | 0.192 | 0.196 | 0.201 | 0.199 | 0.195 | 0.191 | 0.189 |
| 0.187 | 0.192 | 0.198 | 0.197 | 0.198 | 0.201 | 0.201 | 0.194 | 0.192 |
| 0.192 | 0.200 | 0.198 | 0.197 | 0.198 | 0.199 | 0.196 | 0.196 | 0.196 |
| 0.194 | 0.199 | 0.200 | 0.195 | 0.194 | 0.194 | 0.195 | 0.196 | 0.197 |
| 0.194 | 0.199 | 0.197 | 0.197 | 0.200 | 0.196 | 0.197 | 0.198 | 0.196 |
| 0.191 | 0.196 | 0.198 | 0.198 | 0.195 | 0.196 | 0.199 | 0.198 | 0.198 |
| 0.190 | 0.197 | 0.201 | 0.199 | 0.198 | 0.196 | 0.198 | 0.198 | 0.193 |
| 0.187 | 0.197 | 0.199 | 0.198 | 0.200 | 0.202 | 0.198 | 0.197 | 0.192 |
| | 0.191 | 0.197 | 0.198 | 0.196 | 0.199 | 0.195 | 0.193 | 0.186 |
| | 0.185 | 0.193 | 0.194 | 0.195 | 0.195 | 0.194 | 0.185 | |

FIG. 4

| 304 | 306 | 308 | 310 | 312 | 314 | 316 | 318 |
|---|---|---|---|---|---|---|---|
| 0.187 | 0.185 | 0.188 | 0.192 | 0.189 | 0.186 | 0.186 | 0.184 |
| 0.186 | 0.194 | 0.198 | 0.201 | 0.199 | 0.195 | 0.190 | 0.190 |
| 0.195 | 0.199 | 0.199 | 0.199 | 0.200 | 0.200 | 0.195 | 0.194 |
| 0.201 | 0.199 | 0.198 | 0.197 | 0.200 | 0.198 | 0.198 | 0.197 |
| 0.201 | 0.201 | 0.198 | 0.201 | 0.196 | 0.197 | 0.198 | 0.198 |
| 0.201 | 0.199 | 0.198 | 0.198 | 0.198 | 0.198 | 0.200 | 0.199 |
| 0.199 | 0.198 | 0.200 | 0.198 | 0.198 | 0.200 | 0.200 | 0.199 |
| 0.197 | 0.200 | 0.199 | 0.198 | 0.197 | 0.196 | 0.198 | 0.196 |
| 0.196 | 0.197 | 0.197 | 0.195 | 0.198 | 0.195 | 0.196 | 0.193 |
| 0.191 | 0.195 | 0.195 | 0.195 | 0.196 | 0.195 | 0.193 | 0.187 |
| 0.185 | 0.193 | 0.193 | 0.195 | 0.195 | 0.193 | 0.186 |  |

| 304 | 306 | 308 | 310 | 312 | 314 | 316 | 318 |
|---|---|---|---|---|---|---|---|
| 0.014 | 0.016 | 0.013 | 0.009 | 0.012 | 0.015 | 0.015 | 0.017 |
| 0.015 | 0.008 | 0.003 | 0.000 | 0.002 | 0.006 | 0.012 | 0.011 |
| 0.006 | 0.003 | 0.003 | 0.002 | 0.001 | 0.002 | 0.007 | 0.007 |
| 0.000 | 0.002 | 0.003 | 0.004 | 0.001 | 0.004 | 0.003 | 0.004 |
| 0.000 | 0.000 | 0.003 | 0.000 | 0.005 | 0.005 | 0.003 | 0.003 |
| 0.002 | 0.003 | 0.001 | 0.003 | 0.003 | 0.003 | 0.001 | 0.003 |
| 0.004 | 0.001 | 0.003 | 0.003 | 0.004 | 0.003 | 0.003 | 0.006 |
| 0.005 | 0.004 | 0.004 | 0.003 | 0.003 | 0.005 | 0.005 | 0.008 |
| 0.011 | 0.006 | 0.006 | 0.006 | 0.005 | 0.006 | 0.008 | 0.015 |
| 0.016 | 0.009 | 0.008 | 0.007 | 0.007 | 0.008 | 0.016 |  |

| 302 | 304 | 306 | 308 | 310 | 312 | 314 | 316 | 318 |
|---|---|---|---|---|---|---|---|---|
| 7.9 | 6.0 | 6.6 | 5.4 | 3.7 | 5.1 | 6.2 | 6.3 | 6.9 |
| 6.6 | 6.2 | 3.2 | 1.4 | 0.0 | 1.0 | 2.6 | 4.8 | 4.5 |
| 4.1 | 2.6 | 1.1 | 1.1 | 1.0 | 0.3 | 0.7 | 2.7 | 2.9 |
| 2.3 | 0.0 | 0.7 | 1.2 | 1.0 | 0.5 | 1.5 | 1.4 | 1.7 |
| 1.7 | 0.0 | 0.0 | 1.4 | 1.6 | 2.1 | 1.9 | 1.2 | 1.3 |
| 1.2 | 1.0 | 1.0 | 1.2 | 0.0 | 1.4 | 1.2 | 0.4 | 1.1 |
| 2.6 | 1.7 | 1.2 | 0.4 | 1.3 | 1.1 | 0.7 | 0.6 | 2.3 |
| 4.0 | 2.0 | 0.5 | 1.1 | 1.3 | 1.6 | 1.3 | 1.2 | 3.3 |
| 6.5 | 4.4 | 1.8 | 1.8 | 1.3 | 1.2 | 2.3 | 2.2 | 6.0 |
|     | 6.7 | 2.5 | 2.5 | 2.6 | 2.3 | 2.6 | 3.3 |     |
|     |     | 3.5 | 3.3 | 2.7 | 2.8 | 3.2 | 6.4 |     |

FIG. 6A (600)

| 302 | 304 | 306 | 308 | 310 | 312 | 314 | 316 | 318 |
|---|---|---|---|---|---|---|---|---|
| 0.000 | 0.005 | 0.003 | 0.006 | 0.010 | 0.007 | 0.004 | 0.004 | 0.002 |
| 0.003 | 0.004 | 0.011 | 0.016 | 0.018 | 0.017 | 0.013 | 0.008 | 0.008 |
| 0.009 | 0.013 | 0.017 | 0.016 | 0.017 | 0.018 | 0.017 | 0.013 | 0.012 |
| 0.014 | 0.019 | 0.017 | 0.016 | 0.015 | 0.018 | 0.016 | 0.016 | 0.015 |
| 0.015 | 0.019 | 0.019 | 0.016 | 0.019 | 0.014 | 0.015 | 0.018 | 0.016 |
| 0.016 | 0.018 | 0.017 | 0.018 | 0.016 | 0.016 | 0.016 | 0.018 | 0.016 |
| 0.013 | 0.017 | 0.016 | 0.017 | 0.016 | 0.016 | 0.017 | 0.016 | 0.014 |
| 0.009 | 0.015 | 0.018 | 0.015 | 0.016 | 0.015 | 0.016 | 0.014 | 0.011 |
| 0.003 | 0.014 | 0.015 | 0.013 | 0.013 | 0.016 | 0.014 | 0.011 | 0.005 |
|       | 0.008 | 0.013 | 0.011 | 0.013 | 0.014 | 0.013 | 0.004 |       |
|       | 0.003 | 0.011 |       |       | 0.012 | 0.011 |       |       |

| 302 | 304 | 306 | 308 | 310 | 312 | 314 | 316 | 318 |
|---|---|---|---|---|---|---|---|---|
| 0.0 | 1.9 | 1.3 | 2.5 | 4.2 | 2.8 | 1.7 | 1.6 | 0.9 |
| 1.3 | 1.7 | 4.7 | 6.5 | 7.6 | 6.9 | 5.3 | 3.1 | 3.3 |
| 3.8 | 5.3 | 6.8 | 6.8 | 6.9 | 7.6 | 7.2 | 5.2 | 5.0 |
| 5.6 | 7.7 | 7.1 | 6.7 | 6.9 | 7.4 | 6.4 | 6.5 | 6.1 |
| 6.1 | 7.9 | 7.7 | 6.5 | 6.3 | 5.8 | 6.0 | 6.7 | 6.6 |
| 6.7 | 7.6 | 6.9 | 6.7 | 7.6 | 6.5 | 6.7 | 7.5 | 6.8 |
| 5.3 | 6.9 | 6.7 | 7.5 | 6.6 | 6.7 | 7.2 | 7.3 | 5.6 |
| 3.9 | 6.2 | 7.4 | 6.8 | 6.6 | 6.3 | 6.6 | 6.7 | 4.6 |
| 1.4 | 5.8 | 6.0 | 6.1 | 6.6 | 6.7 | 5.6 | 5.6 | 1.9 |
|     | 3.5 | 5.3 | 5.4 | 5.3 | 5.6 | 5.3 | 4.6 |     |
|     | 1.2 | 4.4 | 4.6 | 5.2 | 5.1 | 4.6 | 1.4 |     |

APPARATUS AND METHOD FOR FORMING PHOTORESIST PATTERN WITH TARGET CRITICAL DIMENSION

CROSS REFERENCE TO RELATED APPLICATION

The present application is related to co-pending U.S. patent application Ser. No. 09/606,374 filed on Jun. 28, 2000, titled "Apparatus and Method for Compensating Critical Dimension Deviations Across Photomask," by inventor David H. Ziger, assigned to the assignee of the present application, which is incorporated herein by reference.

BACKGROUND OF THE INVENTION

1. Field of the Invention

This invention relates generally to the field of semiconductor processing. More particularly, the present invention relates to forming photoresist patterns on an exposure field of a semiconductor wafer.

2. Description of the Related Art

The manufacturing of integrated circuit (IC) chips involves many processes. One of the major processes in manufacturing IC chips is photolithography. Photolithography is a process used to transfer masks containing patterns to the surface of a silicon wafer. In a photolithography process, patterns are transferred from a mask to a light sensitive material called photoresist using a light source to print the patterns onto the surface of the wafer. A chemical or plasma etching is then used to transfer the pattern from the photoresist to the surface of the wafer. Fabrication of IC chips may require a number of photolithography processes depending on the complexity of the circuits in the IC chips.

Today, the dimensions of IC components are becoming increasingly smaller. The smaller device dimensions allow more circuit devices to be provided in an IC chip. Accordingly, the precision and accuracy in performing various processes, and photolithography in particular, are critical in producing properly functioning semiconductor IC devices.

In the photolithography process, the printing of mask patterns onto a silicon wafer is typically performed using a projection aligner and stepper device. Conventional projection aligner and stepper device are described in detail in U.S. patent application Ser. No. 09/141,807, entitled "An Apparatus and Method for the Improvement of Illumination Uniformity in Photolithographic Systems," which is incorporated herein by reference. In using a stepper device, for example, an area in a semiconductor wafer exposed to the stepper device is commonly known as a exposure field. The stepper device "steps" over the fields of the surface of a wafer to print mask patterns.

Unfortunately, printing mask patterns onto wafers using conventional stepper devices often produces variations in critical dimension linewidths across a exposure field. This variation in critical dimension results from a number of factors such as imperfect light illumination, lens, and/or mask in the stepper device. Such variation in linewidths may result in IC chips that are either defective or do not perform to application specification.

In view of the foregoing, what is needed is an apparatus and a method for providing uniform linewidths across the exposure field to improve the yield and performance of IC chips.

SUMMARY OF THE INVENTION

Broadly speaking, the present invention fills these needs by providing an apparatus and method for forming a photoresist pattern with a target critical dimension on an exposure field. It should be appreciated that the present invention can be implemented in numerous ways, including as a process, an apparatus, a system, a device, or a method. Several inventive embodiments of the present invention are described below.

In one embodiment, the present invention provides an apparatus for forming a photoresist pattern with a target critical dimension on an exposure field on a semiconductor wafer. The apparatus includes a light source, a lens, and a filter. In the apparatus, the light source is adapted to generate actinic radiation for illuminating a photomask pattern onto the exposure field on the semiconductor wafer. The lens is arranged to focus the actinic radiation from the light source. The filter has a substrate that is transparent to the actinic radiation with the substrate being partitioned into a plurality of regions. One or more regions in the substrate is implanted with a dopant species adapted to absorb the actinic radiation from the lens to change the critical dimension of the one or more regions to the target critical dimension. In this configuration, the plurality of regions in the filter transmits the actinic radiation from the lens to the photomask for illuminating the exposure field on the semiconductor wafer to form a photoresist pattern on the exposure field with the target critical dimension.

In another embodiment, the present invention provides a method for forming a photoresist pattern with a target critical dimension on an exposure field on a semiconductor wafer. In this method, the exposure field is partitioned into a plurality of regions. A set of critical dimension deviation maps is created for a set of line orientations over a first exposure field with one critical dimension map for each line orientation. Each critical dimension deviation map defines an average critical dimension for each of the regions in the exposure field. An average deviation value for each of the regions from the set of critical dimension deviation maps is then evaluated. Based on the average deviation value for each of the regions, an amount of light absorption needed to correct for a critical dimension deviation from the target critical dimension is determined for each of the regions. An absorbing species is then implanted in one or more regions in a transparent substrate to form a filter. The absorbing species is adapted to absorb actinic radiation from a light source to change the critical dimension of the one or more regions in the exposure field to the target critical dimension. The exposure field on a semiconductor wafer is then exposed to the actinic radiation through the filter such that the plurality of regions in the filter transmits the actinic radiation from a lens to a photomask for illuminating the exposure field on a semiconductor wafer to form a photoresist pattern on the exposure field with the target critical dimension.

The absorbing species may be implanted in the filter for use with either a positive or negative resist. When used with a positive resist, the target critical dimension value is the highest critical dimension value selected from the plurality of regions. In this case, the dopant species is implanted to increase the critical dimension of the one or more regions to the target critical dimension. On the other hand, when used with a negative resist, the target critical dimension value is the lowest critical dimension value selected from the plurality of regions. The implanting of the dopant species decreases the critical dimension of the one or more regions to the target critical dimension in this case.

The implanting of filter with light absorbing species provides several advantages. For example, by implanting absorbing species rather than varying the thickness of the filter layer, the phase of the incoming light is not changed. Thus, the filter does not adversely affect lithography. In addition, the filter can be constructed without lithography by scanning the filter under an implant beam at different exposure dosage to impart varying doses of implanted species. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for an apparatus and method for forming a photoresist pattern with a target critical, dimension on an exposure field. It will be obvious, however, to one skilled in the art, that the present invention may be practiced without some or all of these specific details. In other instances, well known circuits, systems, and process operations have not been described in detail in order not to unnecessarily obscure the present invention.

Figure 1:
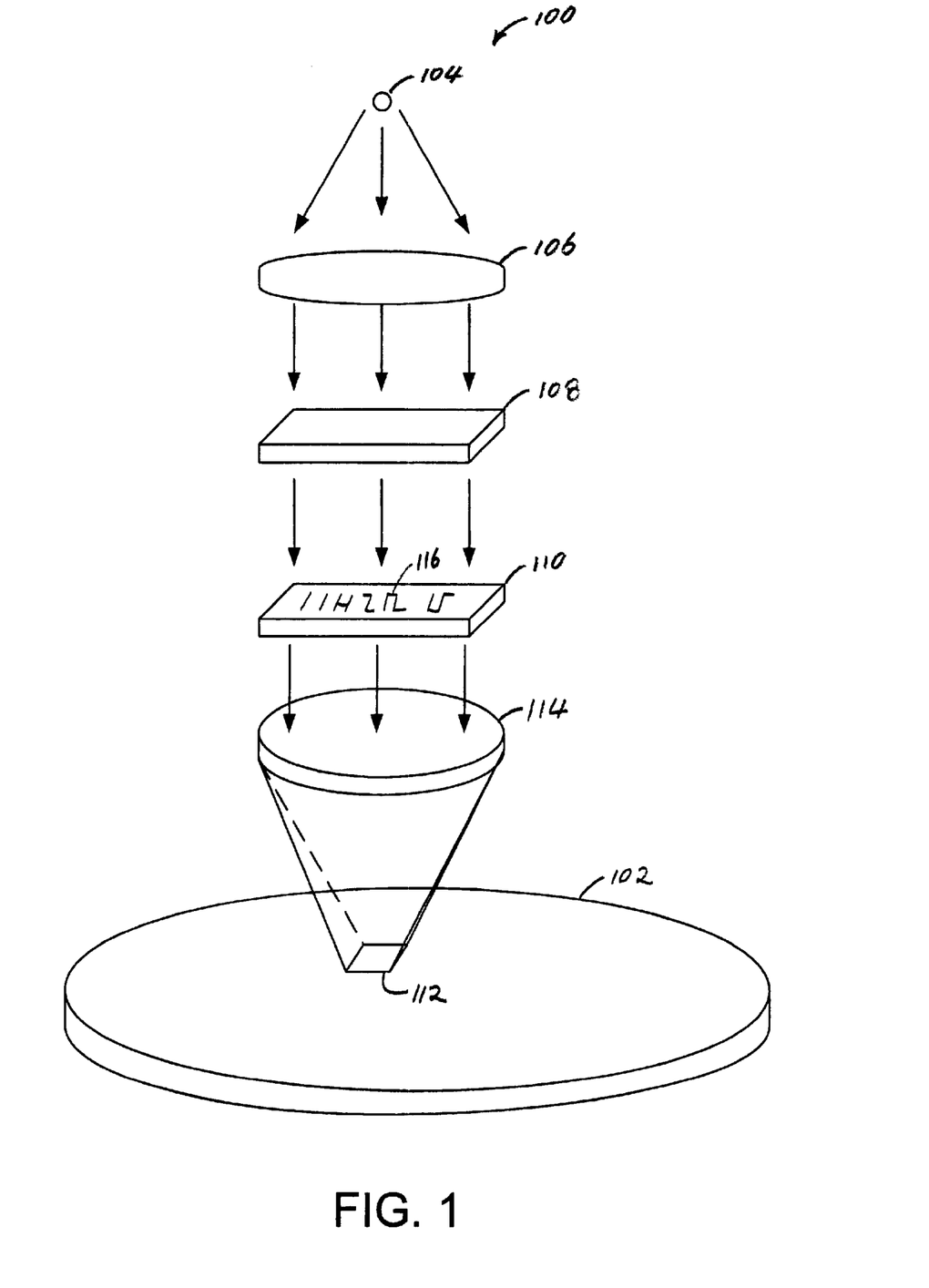
FIG. 1 illustrates, an exemplary optical apparatus for forming a photoresist pattern onto a semiconductor wafer in accordance with one embodiment of the present invention.

FIG. 1 illustrates an exemplary optical apparatus 100 for forming a photoresist pattern onto a semiconductor wafer 102 in accordance with one embodiment of the present invention. In this apparatus 100, a light source 104 produces light in the form of actinic radiation for illuminating a mask pattern onto the wafer 102. For example, the light source 104 may generate actinic radiation such as Deep UV light or X-ray of varying wavelengths (e.g., 193 nm, 150 nm, 365 nm, 248 nm, etc.). The actinic radiation is adapted to induce photochemical activity in printing a photoresist material onto an exposure field on a semiconductor wafer.

The light from the light source 104 is directed to a condenser lens 106, which focuses the light and transmits the focused light to a filter 108. The filter 108 filters the light from the lens 106 and, at the same time, compensates for variations in the linewidths for forming uniform linewidths in a photoresist pattern. As will be discussed in more detail below, the filter 108 is implanted with absorbing species in one or more regions. The absorbing species are designed to attenuate or absorb light from the lens 106 to compensate for variations in linewidths. For example, the amount of absorbing species in the regions in the filter 108 may vary so as to absorb or attenuate light from the lens in different amounts. The addition of absorbing species thus has the effect of making the linewidths larger when used with a positive photoresist and smaller when used with a negative photoresist.

The filtered light is then directed to a mask 110 that includes one or more patterns 116. The filtered light exposes or illuminates the patterns 116 in the mask 110 onto a field 112 (e.g., exposure field) on the wafer 102 through a reduction lens 114. The reduction lens 114 is adapted to reduce the size of the patterns to specified target size. The light exposure allows the patterns 116 to be printed or formed on the field 112 in the wafer 102. Since the implantation of absorbing species in the filter 108 is designed to compensate for variations in linewidths across the field, the variations in critical dimension linewidths are minimized. After printing the patterns onto the field 112, other fields on the wafer 102 may be exposed in a similar manner to form photoresist patterns.

Figure 2A:
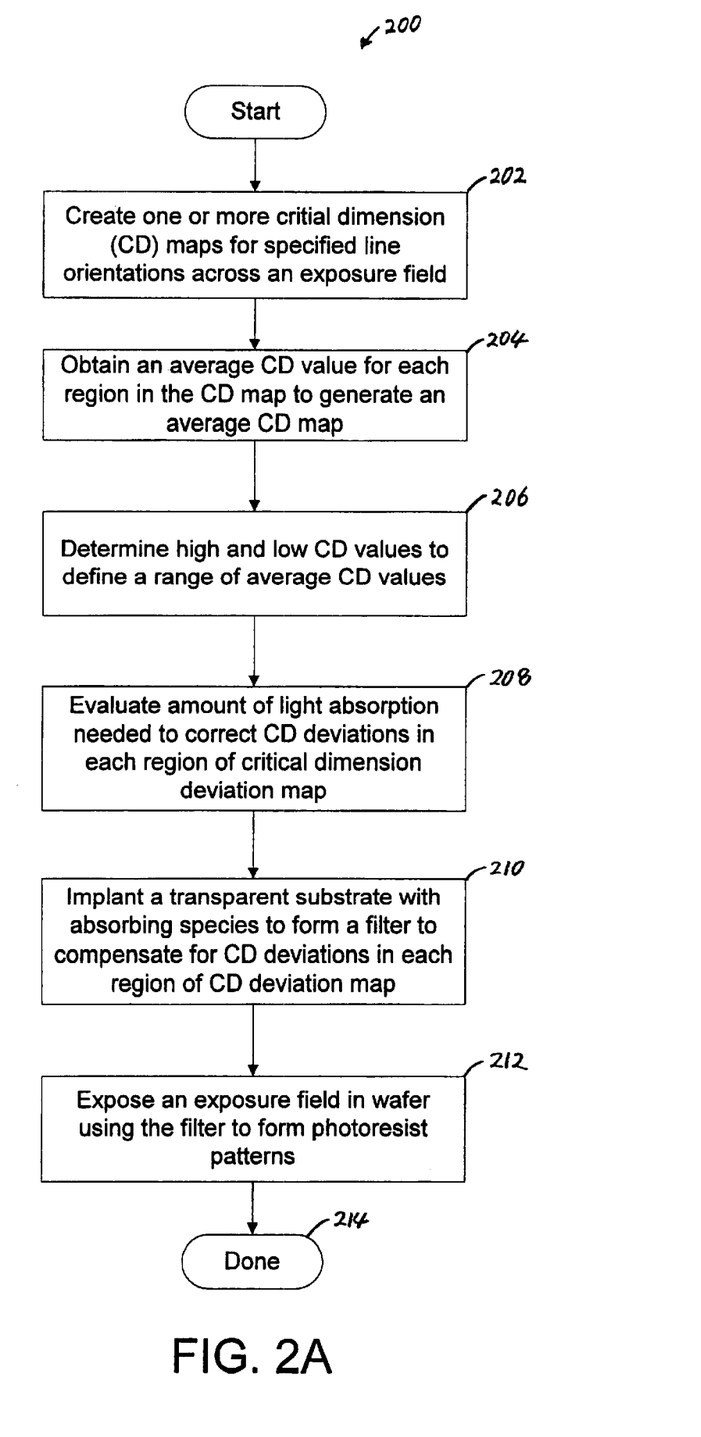
FIG. 2A shows a flowchart of a method for forming a photoresist layer on an exposure field in the wafer using the optical apparatus in accordance with one embodiment of the present invention.

FIG. 2A shows a flowchart of a method 200 for forming a photoresist layer on an exposure field in the wafer 112 using the optical apparatus 100 in accordance with one embodiment of the present invention. In operation 202, one or more critical dimension maps are created for specified line orientations across an exposure field. This operation maps out the lens by partitioning the exposure field into a plurality of regions such as 3×3, 9×9, or 11×9 matrix to quantify the critical dimension variations across the exposure field. For simplicity, the critical dimension measurements are made with a mask that has repeating structures with the same dimensions spaced over the lens field.

Preferably, the exposure field is partitioned into a plurality of regions so that critical dimension deviation maps are generated for each of the regions. In one embodiment, a critical dimension map is produced for horizontal lines in the regions and another critical dimension deviation map is created for vertical lines in the regions. However, any other line orientation such as 45-degree lines may be used to create critical dimension maps.

From the critical dimension maps of horizontal and vertical lines, an average deviation value is evaluated for each region to produce an average critical dimension map in operation 204. That is, for each region in the field, the horizontal and vertical linewidths are averaged to produce average critical dimension values for the regions. Based on the average deviation value of each regions, a high deviation value and a low deviation value are determined in operation 206. The high and low deviation values define a range of average deviation for the regions defined as maximum and minimum CD values, respectively.

After determining the high and low deviation values, the amount of light absorption needed to compensate for CD deviations in each region of the field is determined in operation 208. By way of example, a proportionality constant $\alpha$ may be defined as the change in critical dimension per line width change, yielding a unit of energy per unit area per line width. Given a total light exposure dose E required to nominally print and required deviation correction C, the amount of light absorption A needed is defined as follows: $A=(\alpha*C)/E$. To increase the linewidth by 17 nm, for example, given E of 170 Joules/m$^2$ and $\alpha$ of 700 (Joules/m$^2$)/$\mu$m, requires $(0.017~\mu m)(700~\text{Joules/m}^2)/\mu m)/(170~\text{Joules/m}^2)*100\%$ decrease in light exposure using a positive resist.

Once the changes in exposure dosage needed to compensate for deviations in each of the regions have been evaluated, an absorbing species is implanted in the filter 108 corresponding to the regions of the field 112 to obtain the exposure dosage changes in operation 210. The filter 108 is a substrate of transparent material such as glass or quartz. Some examples of absorbing species that may be implanted in the filter 108 are boron, oxygen, sodium, or any other suitable material that can be implanted to absorb actinic radiation. Using the compensated filter 108, the optical apparatus 100 is then used to expose fields on a wafer to form the photoresist patterns in the mask in operation 212. The method then terminates in operation 214.

Figure 2B:
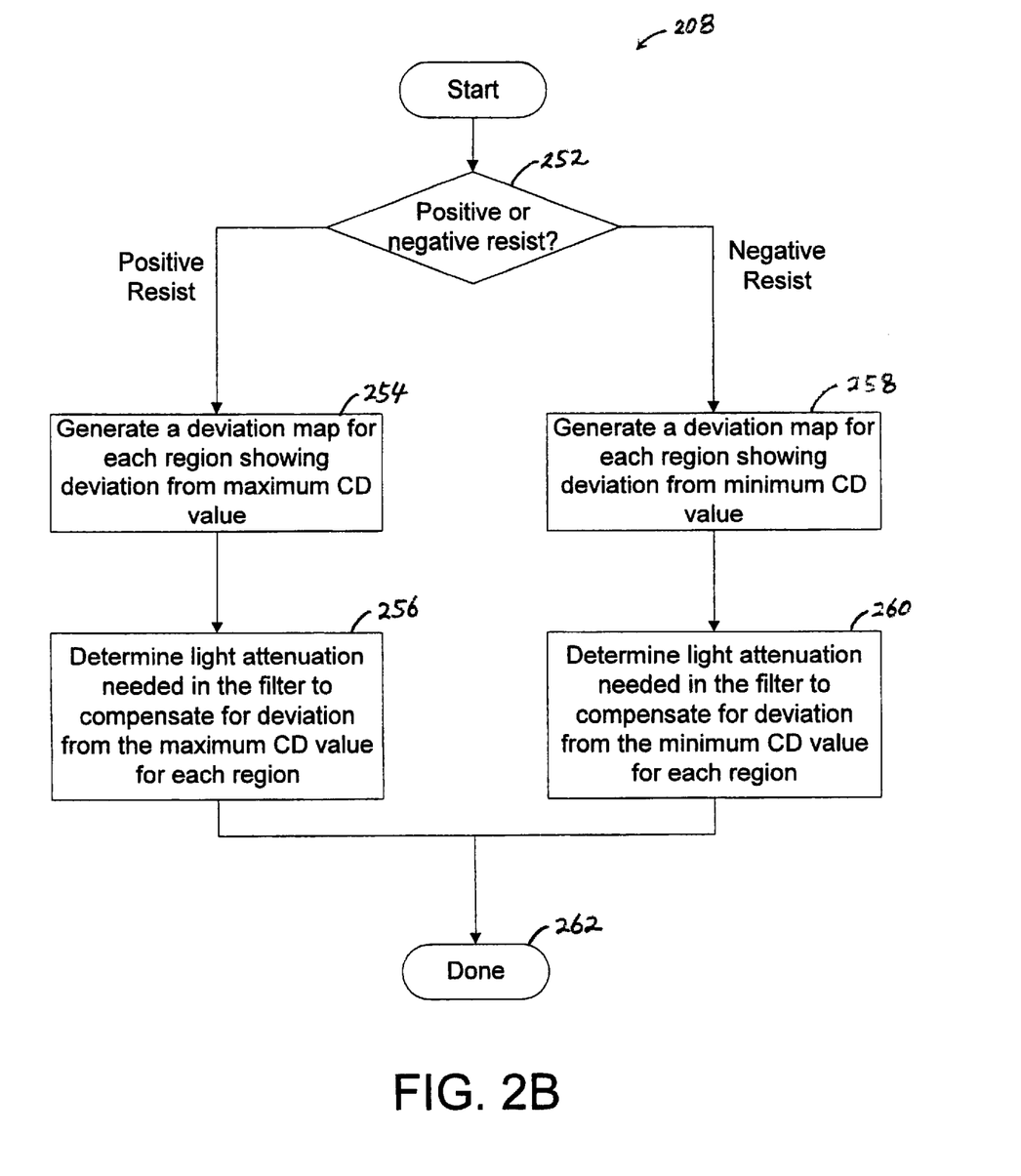
FIG. 2B shows a flowchart for evaluating the amount of light absorption needed to correct CD deviations in each region for either a positive or negative resist used for forming patterns on the exposure field.

FIG. 2B shows a more detailed flowchart of the operation 208 for evaluating the amount of light absorption needed to correct CD deviations in each region for either a positive or negative resist used for forming the patterns 116 on the exposure field 112. In operation 252, it is determined whether the resist is a positive or negative resist. If the resist is a positive resist, the amount of light needs to be attenuated in regions with critical dimensions smaller than the maximum CD value so as to increase the CD dimensions to that of the maximum CD value. In this case, a deviation map for the positive resist is generated by evaluating the difference between the maximum CD value and the local CD deviation value from the average critical dimension map. Then, the light attenuation needed in the filter 108 to compensate for deviation from the maximum CD value is determined for each of the regions in the filter 108 in operation 256.

On the other hand, if the resist is a negative resist, the amount of actinic radiation is attenuated in regions with features larger than the minimum CD value to decrease the CD dimensions to that of the minimum CD value. In this situation, a deviation map for the negative resist is generated by evaluating the difference between the local CD deviation value and the minimum CD value from the average critical dimension map as shown in operation 258. Then, the light attenuation needed in the filter 108 to compensate for the deviation from the minimum CD value is determined for each of the regions in the filter 108 in operation 260.

Figure 3A:
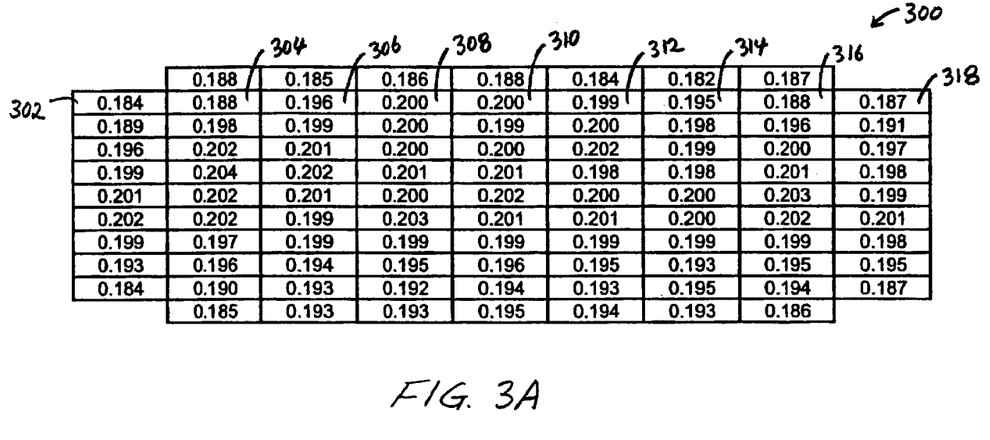
FIG. 3A shows an exemplary horizontal deviation map of an exposure field in accordance with one embodiment of the present invention.
Figure 3B:
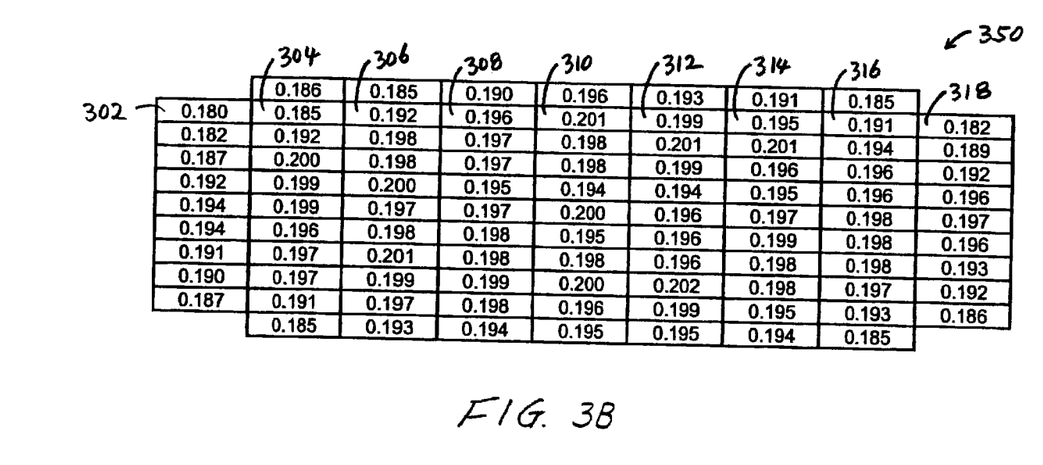
FIG. 3B illustrates an exemplary vertical deviation map of the exposure field in accordance with one embodiment of the present invention.

FIGS. 3A and 3B are horizontal and vertical critical dimension maps 300 and 350 generated in accordance with operation 202 of FIG. 2A. Specifically, FIG. 3A shows an exemplary horizontal deviation map 300 of an exposure field in accordance with one embodiment of the present invention. As shown, each of the blocks in the map 300 represents a region exhibiting an average horizontal linewidth in the associated region. For example, regions 302, 304, 306, 308, 310, 312, 314, 316, and 318 exhibit horizontal linewidths of 0.184 $\mu$m, 0.188 $\mu$m, 0.196 $\mu$m, 0.200 $\mu$m, 0.200 $\mu$m, 0.199 $\mu$m, 0.195 $\mu$m, 0.188 $\mu$m, and 0.187 $\mu$m, respectively.

FIG. 3B illustrates an exemplary vertical deviation map 350 of the same exposure field in accordance with one embodiment of the present invention. Each of blocks in the vertical deviation map 350 represents a region exhibiting vertical linewidth in the associated region. For example, regions 302, 304, 306, 308, 310, 312, 314, and 316 show vertical linewidths of 0.180 $\mu$m, 0.185 $\mu$m, 0.192 $\mu$m, 0.196 $\mu$m, 0.201 $\mu$m, 0.199 $\mu$m, 0.195 $\mu$m, 0.191 $\mu$m, and 0.182 $\mu$m, respectively. While the field is partitioned into an 11×9 matrix for the horizontal and vertical deviation maps 300 and 350, it may also be partitioned into any number of regions to compensate for linewidth deviations across the field. It is noted that the horizontal and vertical linewidths for corner regions of the maps 300 and 350 are not evaluated since these regions typically lie outside the printable field of the lens.

Figure 4:
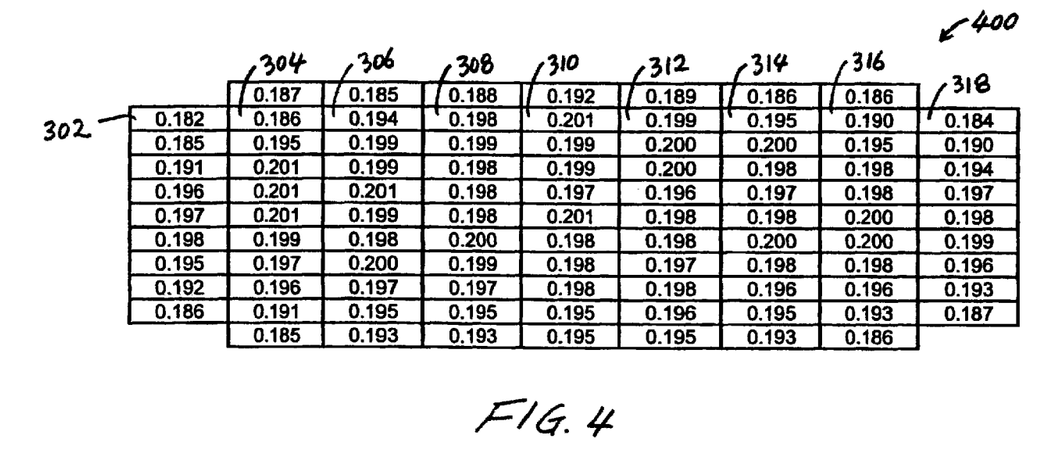
FIG. 4 is an average deviation map of the horizontal and vertical critical dimension maps in accordance with one embodiment of the present invention.

FIG. 4 is an average deviation map 400 of the horizontal and vertical critical dimension maps 300 and 350 generated under operation 204 of FIG. 2A in accordance with one embodiment of the present invention. Each of the regions 302 to 318 in the average deviation map 400 exhibits an average critical dimension value obtained by averaging the horizontal and vertical deviations of horizontal and vertical deviation maps 300 and 350 of corresponding regions. For example, the average critical dimensions of regions 302, 304, 306, 308, 310, 312, 314, 316, and 318 are 0.0182 $\mu$m, 0.186 $\mu$m, 0.194 $\mu$m, 0.198 $\mu$m, 0.201 $\mu$m, 0.199 $\mu$m, 0.195 $\mu$m, 0.190 $\mu$m, and 0.184 $\mu$m, respectively. Each of these values are derived by averaging the critical dimensions from the associated regions in the horizontal and vertical critical dimension maps 300 and 350. The average critical dimension values for other regions are similarly obtained by averaging the horizontal and vertical deviation values from the horizontal and vertical deviation maps 300 and 350.

Figure 5A:
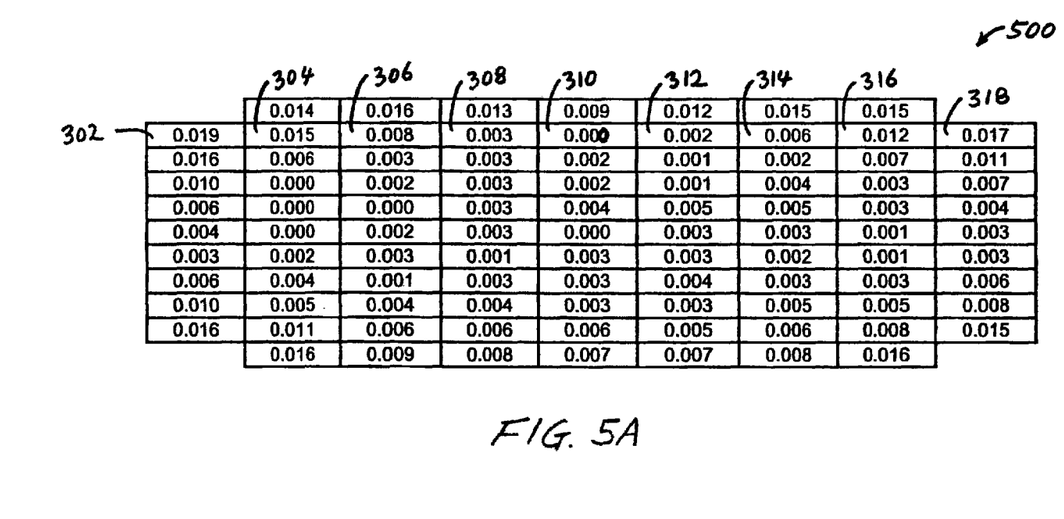
FIG. 5A shows a deviation map generated from the average critical dimension map for a positive resist in accordance with one embodiment of the present invention.

The present invention allows use of either a positive or negative resist for imprinting patterns onto an exposure field. For either type of resists, a deviation map and an attenuation map are created from the average critical dimension map 400. FIG. 5A shows a deviation map 500 generated from the average critical dimension map 400 for a positive resist under operation 254 of FIG. 2B in accordance with one embodiment of the present invention. To determine a critical dimension deviation value for each of the regions, the highest average critical dimension is selected from the average CD map 400 as the maximum CD value. Then, the critical dimension deviation value for each region is evaluated by computing the difference between the maximum CD value and the local average CD value in the average CD map 400.

For example, in the average CD map 400, the highest CD value of 0.201 $\mu$m in region 310 is selected as the maximum critical dimension. Then, the difference between the maximum critical dimension and the average critical dimension for each region in the average critical dimension map 400 is computed to determine a critical dimension deviation to generate the deviation map 500. By way of example, regions 302, 304, 306, 308, 310, 312, 314, 316, and 318 show critical dimension deviations of 0.019 $\mu$m, 0.015 $\mu$m, 0.008 $\mu$m, 0.003 $\mu$m, 0.001 $\mu$m, 0.002 $\mu$m, 0.006 $\mu$m, 0.012 $\mu$m, and 0.017 $\mu$m, respectively, from the maximum critical dimension of 0.201 $\mu$m. The critical dimension deviation values for other regions in the map 500 are obtained in a similar manner.

Figure 5B:
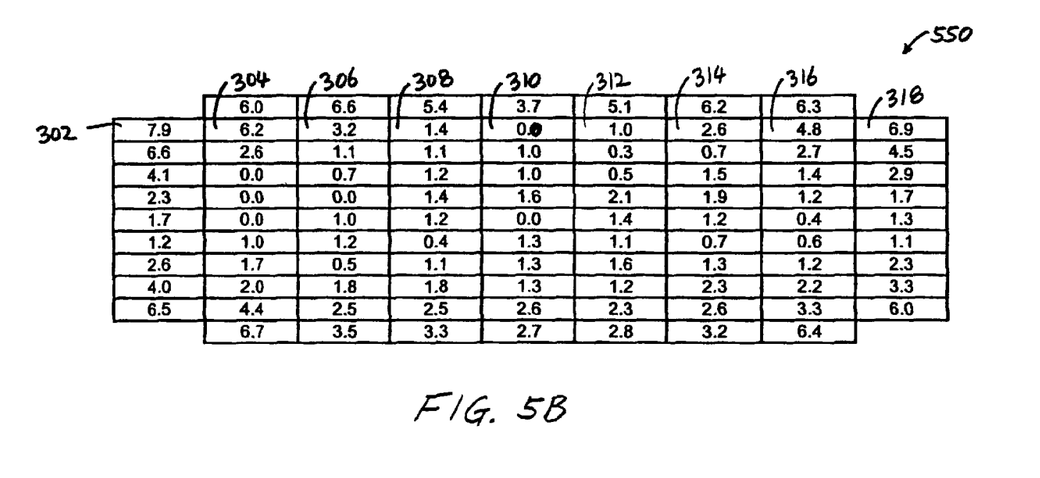
FIG. 5B shows an attenuation map of a filter when using a positive resist in accordance with one embodiment of the present invention.

Once the critical dimension deviation map 500 has been obtained, an attenuation map of the filter 108 showing the light attenuation for each region is generated. FIG. 5B shows an attenuation map 550 generated under operation 256 of FIG. 2B using a positive resist in accordance with one embodiment of the present invention. For example, compensating for critical dimension deviation C of 0.019 µm in region 302 to reach the target maximum critical dimension of 0.201 µm requires light attenuation that will increase the linewidths by 0.019 µm. Using equation $A=(\alpha*C)/E$ discussed above and given E of 170 J/m$^2$ and $\alpha$ of 700 (Joules/m$^2$)/µm, the total amount of light exposure dosage required to increase the critical dimension of region 302 by 0.019 µm is given by $(\alpha*C)$ or (0.019 µm)(700 Joules/m$^2$)/µm), which is 13.3 Joules/m$^2$. The normalized light exposure doze (i.e., percentage of light attenuation or filtering) needed to increase the critical dimension by 0.019 µm is then obtained by 100% *$(\alpha*C)/E$, which is (0.019 µm)(700 Joules/m$^2$)/µm)/(170 Joules/m$^2$)*100% or 7.8% decrease in light exposure using a positive resist.

The amount of light attenuation for other regions in the attenuation map 550 is derived in similar manner. For example, the amounts of light exposure in regions 304, 306, 308, 310, 312, 314, 316, and 318 are attenuated by 6.2%, 3.2%, 1.4%, 0.3%, 1.0%, 2.6%, 4.8%, and 6.9%, respectively. It should be noted that the attenuation map 550 may be converted to a transmission map that indicates the amount of light to be transmitted by subtracting the amount of light attenuation from 100% for each of the regions in the map 550.

Figure 6A:
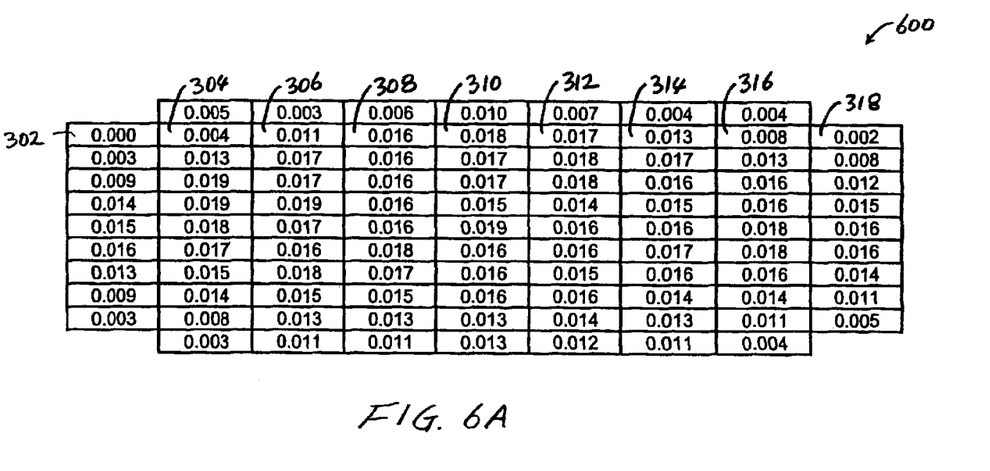
FIG. 6A shows a deviation map generated from the average critical dimension map of FIG. 4 for a negative resist in accordance with one embodiment of the present invention.

FIG. 6A shows a deviation map 600 generated from the average critical dimension map 400 for a negative resist under operation 258 of FIG. 2B in accordance with one embodiment of the present invention. To determine a critical dimension deviation value for each of the regions, the lowest average critical dimension is selected from the average CD map 400 as the minimum CD value. Then, the critical dimension deviation value for each region is evaluated by computing the difference between the local average CD value in the average CD map 400 and the maximum CD value.

As shown in the average CD map 400, the lowest CD value of 0.182 µm in region 302, for example, may be selected as the minimum critical dimension. Then, the difference between the average critical dimension for each region in the average critical dimension map 400 and the minimum critical dimension is computed to determine a critical dimension deviation to generate the deviation map 600. By way of example, regions 302, 304, 306, 308, 310, 312, 314, 316, and 318 show critical dimension deviations of 0 µm, 0.004 µm, 0.011 µm, 0.016 µm, 0.018 µm, 0.017 µm, 0.013 µm, 0.008 µm, and 0.002 µm, respectively, from the minimum critical dimension of 0.182 µm. The critical dimension deviation values for other regions in the map 600 are obtained in a similar manner.

Figure 6B:
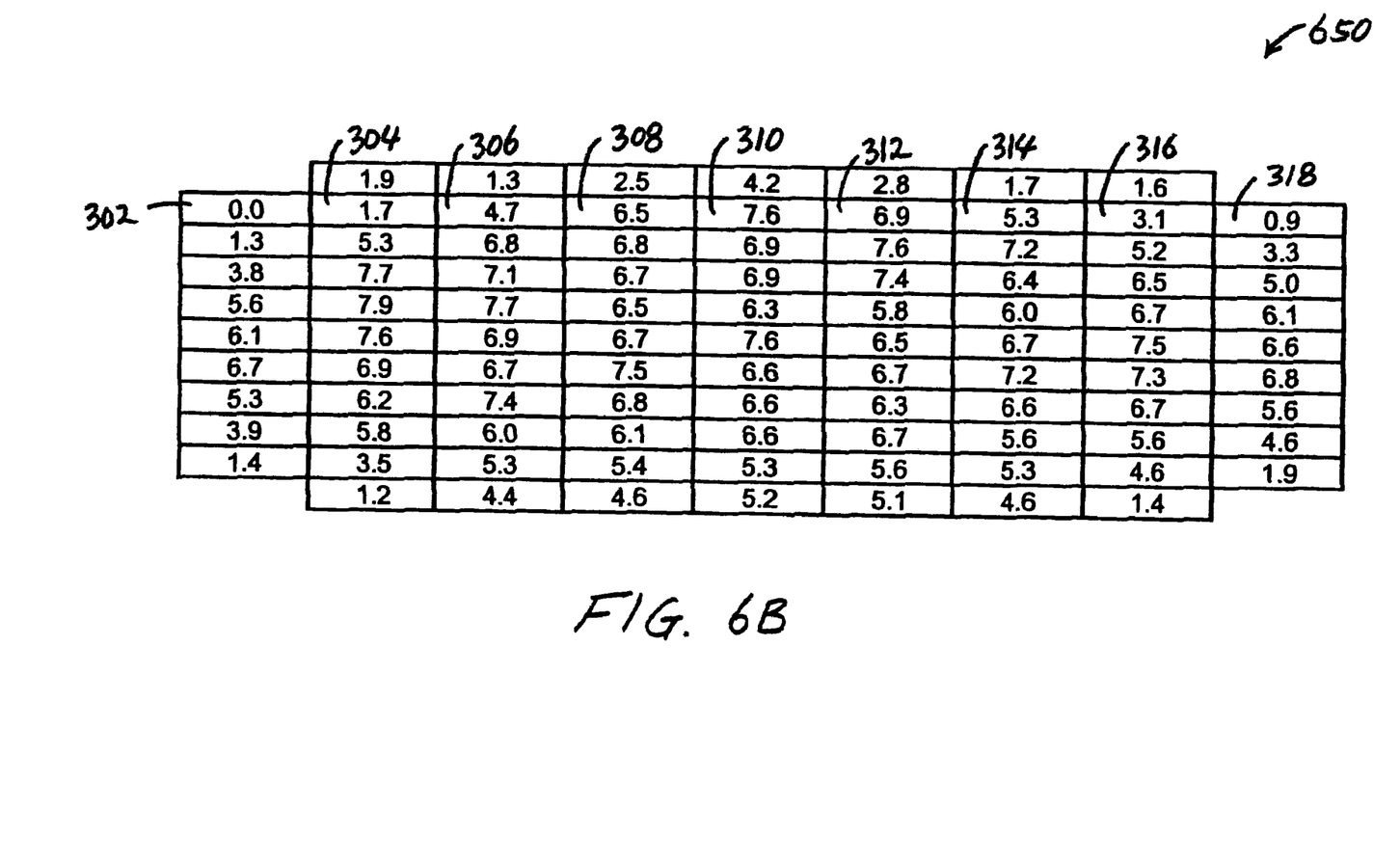
FIG. 6B shows an attenuation map of a filter in accordance with one embodiment of the present invention.

After obtaining the critical dimension deviation map 600, an attenuation map of the filter 108 showing the light attenuation for each region is generated. FIG. 6B shows an attenuation map 650 of the filter 108 generated under operation 260 of FIG. 2B using equation $A=(\alpha*C)/E$ discussed above, given E of 170 J/m$^2$ and $\alpha$ of 700 (Joules/m$^2$)/µm in accordance with one embodiment of the present invention. By way of example, compensating for critical dimension deviation C of 0.018 µm in region 310 to reach the target minimum critical dimension of 0.182 µm requires light attenuation that will decrease the linewidths by 0.019 µm. The total amount of light exposure dosage required to decrease the critical dimension of region 310 by 0.018 µm is given by $(\alpha*C)$ or (0.018 µm)(700 Joules/m$^2$)/µm), which is 12.6 Joules/m$^2$. The normalized light exposure doze (i.e., percentage of light attenuation or filtering) needed to decrease the critical dimension by 0.018 µm is then obtained by 100%*$(\alpha*C)/E$, which is (0.018 µm)(700 Joules/m$^2$)/µm)/(170 Joules/m$^2$)*100% or 7.4% decrease in light exposure using a negative resist.

The amount of light attenuation for other regions in the attenuation map 650 is derived in a similar manner. The amounts of light exposure in regions 302, 304, 306, 308, 312, 314, 316, and 318, for example, are attenuated by 0%, 1.7%, 4.7%, 6.5%, 6.9%, 5.3%, 3.1%, and 0.9%, respectively. The attenuation map 650 of the filter 108 may also be converted to a transmission map that indicates the amount of light to be transmitted by subtracting the amount of light attenuation from 100% for each of the regions in the map 650.

The critical dimension deviation maps 500 and 600 thus indicate the amount of critical dimension to be corrected for each of the regions. When using a positive resist, regions with the maximum CD values are not compensated while other regions less than the maximum CD values are compensated by implanting absorbing species in the associated regions in the filter 108. On the other hand, regions with the minimum CD values are not compensated when using a negative resist while other regions are compensated by implanting light absorbing species in the filter 108.

In one embodiment, a target deviation value may be set instead of using the maximum or minimum critical dimension value. In this case, regions in the filter 108 with deviation values less than the target value are implanted with absorbing species to increase the critical dimension to the target value when using the positive resist. Likewise, when using a negative resist, regions in the filter 108 with critical dimension values greater than the target value are implanted with absorbing species to decrease the critical dimension to the target value.

Figure 7:
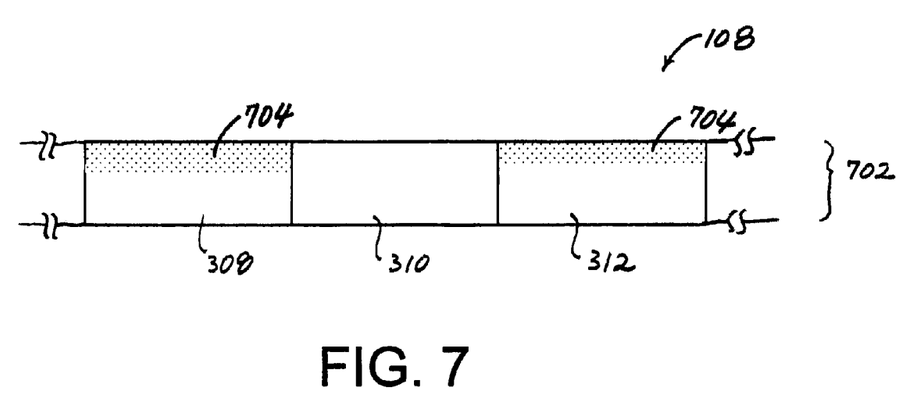
FIG. 7 shows a cross sectional view of exemplary regions of a filter so as to compensate for linewidth variations across the field when using a positive resist in accordance with one embodiment of the present invention.

The light attenuation maps 550 and 650 are used to selectively implant the filter 108 with dopant species. The dopant species are implanted in the filter to absorb actinic radiation to increase or decrease the critical dimension linewidths of regions depending on whether the resist is a positive or negative resist. FIG. 7 shows a cross sectional view of regions 308, 310, and 312 of the filter 108 so as to compensate for linewidth variations across the field when using a positive resist in accordance with one embodiment of the present invention. The filter 108 is made of a substrate 702 that is transparent to actinic radiation such as glass, quartz, transparent plastic, fused silica, calcium fluoride, etc. To increase the linewidths in regions to that of the highest or target deviation value, the substrate 702 is implanted with dopant species 704 in regions 308 and 312 to absorb actinic radiation. For example, light absorbing species such as boron, oxygen, sodium, or the like may be implanted in the substrate 702 to absorb actinic radiation of various wavelengths (e.g., 150 nm, 152 nm, 193 nm, 248 nm, and 365 nm). A quartz substrate implanted with boron, for example, will absorb 248 nm actinic radiation (e.g., DUV) compared to undoped quartz. Since region 308 needs to compensate for 0.003 µm while region 312 requires a correction of 0.002 µm, more dopant species is implanted in region 308 than in region 312. On the other hand, region 310 of the substrate 702, which has the maximum critical dimension value, is not implanted with any light absorbing species. Other regions in the filter 108 may be implanted with absorbing species in a similar manner to increase the linewidth to match the highest or target deviation linewidth. The implanting of dopant species in the filter 108 applies to a negative resist as well.

The implantation of light absorbing species in the filter 108 is designed to decrease the amount of light transmitted to the filed on a wafer. In turn, the decrease in exposure allows increase in linewidths for a positive resist or decrease in linewidths for a negative resist in regions of an exposure field according to the amount of dopant species implanted in the regions. The implantation of absorbing species may be performed, for example, by ion bombardment, chemical vapor deposition, etc. With regions of exposure field thus implanted with light absorbing species, the filter 108 compensates for linewidth variations and allows formation of regions in an exposure field with substantially uniform linewidths.

The implanting of filter with light absorbing species provides several advantages. For example, the apparatus and method of the present invention provides higher yield in manufacturing integrated circuit chips since the substantially uniform critical dimensions improve device performance and reduce failure. Further, by implanting absorbing species rather than varying the thickness of the filter layer, the phase of the incoming light is not changed. Thus, the filter does not adversely affect lithography. In addition, the filter can be constructed without lithography by scanning the filter under an implant beam at different exposure dosage to impart varying doses of implanted species.

While the present invention has been described in terms of several preferred embodiments, there are alterations, permutations, and equivalents which fall within the scope of this invention. It should also be noted that there are alternative ways of implementing both the method, device, and system of the present invention. It is therefore intended that the following appended claims be interpreted as including all such alterations, permutations, and equivalents as fall within the true spirit and scope of the present invention.

What is claimed is:

1. An apparatus for forming a photoresist pattern with a target critical dimension an exposure field on a semiconductor wafer, comprising:
    a light source adapted to generate actinic radiation for illuminating a photomask pattern onto the exposure field on the semiconductor wafer;
    a lens for focusing the actinic radiation from the light source;
    a filter having a substrate that is transparent to the actinic radiation, the substrate being partitioned into a plurality of regions, one or more regions on the substrate being implanted with a dopant species adapted to absorb the actinic radiation from the lens to change the critical dimension of the one or more regions to the target critical dimension, wherein the plurality of regions in the filter transmits the actinic radiation from the lens to the photomask for illuminating the exposure field on the semiconductor wafer to form a photoresist pattern on the exposure field with the target critical dimension.

2. The apparatus as recited in claim 1, wherein the target critical dimension value is the highest critical dimension value selected from the plurality of regions and wherein the dopant species is implanted to increase the critical dimension of the one or more regions to the target critical dimension when used with a positive resist.

3. The apparatus as recited in claim 1, wherein the target critical dimension value is the lowest critical dimension value selected from the plurality of regions and wherein the dopant species is implanted to decrease the critical dimension of the one or more regions to the target critical dimension when used with a negative resist.

4. The apparatus as recited in claim 1, wherein the actinic radiation is adapted to induce photochemical activity for forming the photoresist pattern on the exposure field.

5. The apparatus as recited in claim 1, wherein the dopant species is a chemical selected from the group consisting of boron, oxygen, and sodium.

6. The apparatus as recited in claim 1, wherein the substrate is formed of a material selected from the group consisting of glass, transparent plastic, quartz, fused silica, and calcium fluoride.

7. The apparatus as recited in claim 1, wherein the target critical dimension is an average of horizontal and vertical critical dimensions of the photoresist pattern.

8. The apparatus as recited in claim 1, wherein the target critical dimension is horizontal or vertical critical dimension of the photoresist pattern.

9. The apparatus as recited in claim 1, wherein the critical dimension is a linewidth of the photoresist pattern.

10. The apparatus as recited in claim 1, wherein the actinic radiation is a deep ultraviolet light or X-ray.

11. The apparatus as recited in claim 1, wherein the plurality of regions is a matrix of regions in the exposure field wherein the exposure field is partitioned into an N×M matrix where N and M are integers greater than one.

12. A method for forming a photoresist pattern with a target critical dimension on an exposure field on a semiconductor wafer, comprising:
    partitioning the exposure field into a plurality of regions;
    creating a set of critical dimension deviation maps for a set of line orientations over a first exposure field: with one critical dimension map for each line orientation, each critical dimension deviation map defining an average critical dimension for each of the regions in the exposure field;
    evaluating an average deviation value for each of the regions from the set of critical dimension deviation maps;
    determining an amount of light absorption needed to correct for a critical dimension deviation frorn the target critical dimension in each of the regions based on the average deviation value for each of the regions;
    implanting an absorbing species in one or more regions in a transparent substrate to form a filter, the absorbing species being adapted to absorb an actinic radiation from a light source to change the critical dimension of the one or more regions in the exposure field to the target critical dimension; and
    exposing a second exposure field to the actinic radiation through the filter such that the plurality of regions in the filter transmits the actinic radiation from a lens to a photomask for illuminating a second exposure field on a semiconductor wafer to form a photoresist pattern on the exposure field with the target critical dimension.

13. The method as recited in claim 12, wherein the target critical dimension value is the highest critical dimension value selected from the plurality of regions and wherein the dopant species is implanted to increase the critical dimension of the one or more regions to the target critical dimension when used with a positive resist.

14. The method as recited in claim 12, wherein the target critical dimension value is the lowest critical dimension value selected from the plurality of regions and wherein the dopant species is implanted to decrease the critical dimension of the one or more regions to the target critical dimension when used with a negative resist.

15. The method as recited in claim 12, wherein the actinic radiation is adapted to induce photochemical activity for forming the photoresist pattern on the exposure field.

16. The method as recited in claim 12, wherein the absorbing species is a chemical selected from the group consisting of boron, oxygen, and sodium.

17. The method as recited in claim 12, wherein the transparent substrate is formed of a material selected from the group consisting of glass, transparent plastic, quartz, fused silica, and calcium fluoride.

18. The method as recited in claim 12, wherein set of line orientation includes horizontal and vertical line orientations and wherein the target critical dimension is an average of the horizontal and vertical critical dimensions of the photoresist pattern.

19. The method as recited in claim 12, wherein the critical dimension is a linewidth of the photoresist pattern.

20. The method as recited in claim 12, wherein the actinic radiation is a deep ultraviolet light of X-ray.

21. The method as recited in claim 12, wherein the plurality of regions is a matrix of regions in the exposure field wherein the exposure field is partitioned into an N×M matrix where N and M are integers greater than one.

22. A method for forming a photoresist pattern with a target critical dimension on an exposure field on a semiconductor wafer, the method comprising:
   partitioning the exposure field into a plurality of regions;
   creating horizontal and vertical critical dimension deviation maps for horizontal and vertical line orientations over a first exposure field, each critical dimension deviation map defining an average critical dimension for each of the regions in the exposure field;
   evaluating an average deviation value for each of the regions from the horizontal and vertical critical dimension deviation maps;
   determining an amount of light absorption needed to correct for a critical dimension deviation from a target average deviation value in each of the regions;
   implanting an absorbing species in one or more regions in a transparent substrate to form a filter, the absorbing species being adapted to absorb an actinic radiation from a light source to change the critical dimension of the one or more regions in the exposure field to the target critical dimension value; and
   exposing a second exposure field to the actinic radiation through the filter such that the plurality of regions in the filter transmits the actinic radiation from a lens to a photomask for illuminating the second exposure field on a semiconductor wafer to form a photoresist pattern on the exposure field with the target critical dimension value.

23. The method as recited in claim 22, wherein the target critical dimension value is the highest critical dimension value selected from the plurality of regions and wherein the dopant species is implanted to increase the critical dimension of the one or more regions to the target critical dimension when used with a positive resist.

24. The method as recited in claim 22, wherein the target critical dimension value is the lowest critical dimension value selected from the plurality of regions and wherein the dopant species is implanted to decrease the critical dimension of the one or more regions to the target critical dimension when used with a negative resist.

25. The method as recited in claim 22, wherein the actinic radiation is adapted to induce photochemical activity for forming the photoresist pattern on the exposure field.

26. The method as recited in claim 22, wherein the absorbing species is a chemical selected from the group consisting of boron, oxygen, and sodium.

27. The method as recited in claim 22, wherein the transparent substrate is formed of a material selected from the group consisting of glass, transparent plastic, quartz, fused silica, and calcium fluoride.

28. The method as recited in claim 22, wherein the critical dimension is a linewidth of the photoresist pattern.

29. The method as recited in claim 22, wherein the actinic radiation is a deep ultraviolet light or X-ray.

* * * * *